United States Patent
Wang et al.

(10) Patent No.: US 9,859,312 B1
(45) Date of Patent: Jan. 2, 2018

(54) FEEDBACK CAPACITOR FORMED BY BONDING-VIA IN PIXEL LEVEL BOND

(71) Applicant: OMNIVISION TECHNOLOGIES, INC., Santa Clara, CA (US)

(72) Inventors: Rui Wang, San Jose, CA (US); Hiroaki Ebihara, Santa Clara, CA (US); Zheng Yang, San Jose, CA (US); Chun-Ming Tang, San Jose, CA (US); Chao-Fang Tsai, Nantou (TW); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/427,928

(22) Filed: Feb. 8, 2017

(51) Int. Cl.
*H01L 27/146* (2006.01)

(52) U.S. Cl.
CPC .... *H01L 27/14603* (2013.01); *H01L 27/1464* (2013.01); *H01L 27/14634* (2013.01); *H01L 27/14636* (2013.01)

(58) Field of Classification Search
CPC ......... H01L 27/14603; H01L 27/14634; H01L 27/14636; H01L 27/1464
See application file for complete search history.

(56) References Cited

U.S. PATENT DOCUMENTS

| | | | |
|---|---|---|---|
| 9,553,120 B2* | 1/2017 | Park | H01L 27/14636 |
| 9,666,626 B2* | 5/2017 | Kishi | H01L 27/14634 |
| 2009/0184349 A1* | 7/2009 | Dungan | H01L 27/14634 257/292 |
| 2012/0199882 A1* | 8/2012 | Shin | H01L 27/14607 257/222 |
| 2013/0206962 A1* | 8/2013 | Barr | H01L 27/14601 250/208.1 |
| 2015/0054110 A1* | 2/2015 | Kashihara | H01L 27/14636 257/435 |
| 2015/0115330 A1* | 4/2015 | Park | H01L 27/14636 257/226 |
| 2017/0062501 A1* | 3/2017 | Velichko | H01L 27/14612 |

* cited by examiner

*Primary Examiner* — Allan R Wilson
(74) *Attorney, Agent, or Firm* — Christensen O'Connor Johnson Kindness PLLC

(57) ABSTRACT

An image sensor includes a photodiode disposed in a first semiconductor material, and the photodiode is positioned to absorb image light through the backside of the first semiconductor material. A first floating diffusion is disposed proximate to the photodiode and coupled to receive image charge from the photodiode in response to a transfer signal applied to a transfer gate disposed between the photodiode and the first floating diffusion. A second semiconductor material, including a second floating diffusion, is disposed proximate to the frontside of the first semiconductor material. A dielectric material is disposed between the first semiconductor material and the second semiconductor material, and includes a first bonding via extending from the first floating diffusion to the second floating diffusion, a second bonding via disposed laterally proximate to the first bonding via, and a third bonding via disposed laterally proximate to the first bonding via.

19 Claims, 2 Drawing Sheets

US 9,859,312 B1

FEEDBACK CAPACITOR FORMED BY BONDING-VIA IN PIXEL LEVEL BOND

TECHNICAL FIELD

This disclosure relates generally to semiconductor fabrication, and in particular but not exclusively, relates to wafer bonding.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

As pixels in image sensors get smaller, the closer the pixels in the image sensors become. Accordingly, it may be desirable to electrically isolate individual pixels (and associated circuitry) in the image sensor to prevent electrical crosstalk which may degrade image quality.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figures 1A, 1B:
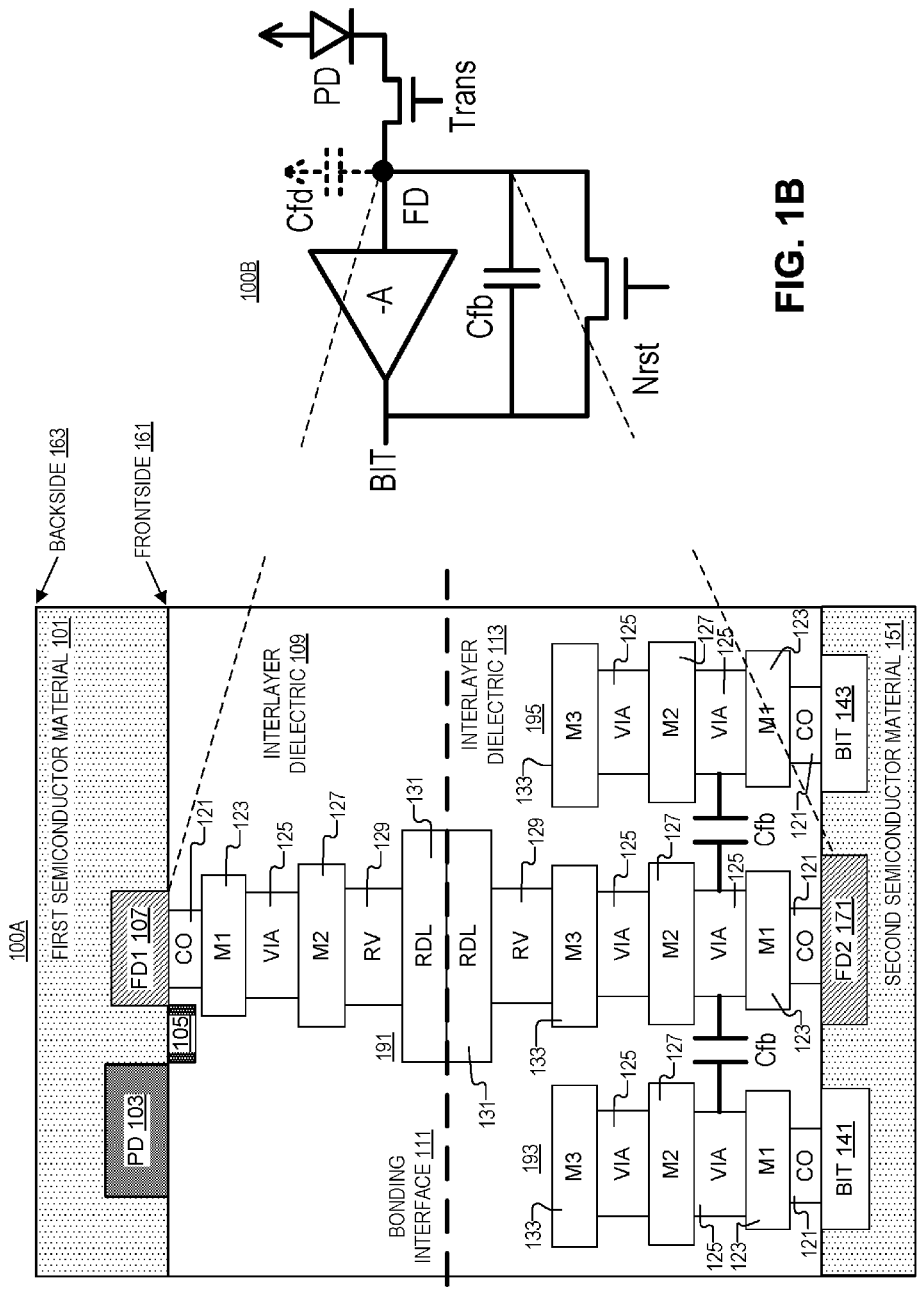
FIG. 1A is a cross sectional illustration of an example wafer bonded image sensor, in accordance with the teachings of the present invention.
FIG. 1B is a circuit diagram of the wafer bonded image sensor in FIG. 1A, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a feedback capacitor formed by a bonding-via in a pixel level bond are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

FIG. 1A is a cross sectional illustration of an example wafer bonded image sensor 100A. Wafer bonded image sensor 100A includes first semiconductor material 101 (with frontside 161 and backside 163), photodiode 103, transfer gate 105, first floating diffusion 107, interlayer dielectric 109/113 (collectively "dielectric material"), bonding interface 111, second semiconductor material 151, second floating diffusion 171, first bitline contact 141, second bitline contact 143, first bonding via 191, second bonding via 193, and third bonding via 195. The first bonding via 191, second bonding via 193, and third bonding via 195 include metal layers 123/127/133, contacts 121, sub vias 125, redistribution layer vias 129, and redistribution layers 131. The structures may all be metal, semiconductor, or the like depending on the processing steps needed. Moreover, one of ordinary skill in the art will appreciate that in other examples there may be more or less than three metal layers in any bonding via (e.g., 2, 4, 5, 6, etc.).

As shown, photodiode 103 is disposed in first semiconductor material 101 which has a frontside 161 and a backside 163 opposite the frontside 161. Photodiode 103 is positioned to absorb image light through the backside 163 of first semiconductor material 101. First floating diffusion 107 is disposed proximate to photodiode 103 and is coupled to receive image charge from photodiode 103 in response to a transfer signal applied to transfer gate 105. Transfer gate 105 is disposed between photodiode 103 and first floating diffusion 107. Second semiconductor material 151 includes second floating diffusion 171, and second semiconductor material 151 is disposed proximate to the frontside 161 of first semiconductor material 101. Dielectric material (e.g., interlayer dielectrics 109/111) is disposed between first semiconductor material 101 and second semiconductor material 151, and includes first bonding via 191 (which extends from first floating diffusion 107 to second floating diffusion 171). Second bonding via 193 is disposed laterally proximate to first bonding via 191, and third bonding via 195 is disposed laterally proximate to first bonding via 191. As shown first bonding via 191 is disposed between second bonding via 193 and third bonding via 195.

In the depicted example, second bonding via 193 and third bonding via 195 are capacitive plates in a capacitor formed by first bonding via 191 and second bonding via 193, and first bonding via 191 and third bonding via 195. In other words, first bonding via 191 is capacitively coupled to second bonding via 193 and third bonding via 195. In the depicted example, second semiconductor material 151 includes first bitline contact 141 and second bitline contact 143; second floating diffusion 171 is laterally disposed between first bitline contact 141 and second bitline contact 143 in second semiconductor material 151. Second bonding via 193 and third bonding via 195 are electrically coupled to first bitline contact 141 and second bitline contact 143, respectively. One of skill in the art will appreciate that first bitline contact 141 and second bitline contact 143 may be on the same bitline (i.e., two contacts to the same bitline).

In the illustrated example, first semiconductor material 101 and second semiconductor material 151 may be wafer-bonded together at bonding interface 111 in the dielectric material. Second bonding via 193 and third bonding via 195 are disposed to not contact first semiconductor material 101. In other words, the second bonding via 193 and third bonding via 195 are disposed on the half of dielectric material closest to the second semiconductor material 151 (e.g., interlayer dielectric 113). In some embodiments, interlayer dielectrics 109/113 may include silicon oxide, silicon nitride, or the like; however in other embodiments they may include high-k materials or otherwise.

In the illustrated example, first bonding via 191 includes a plurality of metal layers (M1 123, M2 127, M3 133), and the cross sectional area (as viewed from the top/backside 163 surface of image sensor 100A) of metal layer M3 133, disposed closest to the bonding interface 111, is larger than a cross sectional area of metal layer M1 123 disposed proximate to at least one of first semiconductor material 101 or second semiconductor material 153. In one embodiment the metal layers may include the same or different metals as one another such as tungsten, copper, or the like. As shown, the plurality of metal layers may be electrically coupled together by a first plurality of sub vias 125 to produce a continuous electrical connection between first floating diffusion 107 and second floating diffusion 171 (e.g., in first bonding via 191). Also in the depicted example, first floating diffusion 107 and second floating diffusion 171 are vertically aligned with respect of surface normal of first semiconductor material 101 and second semiconductor material 151.

As illustrated the first bonding via 191 may include (from first semiconductor material 101 to second semiconductor material 151) contact 121, metal layer 123, sub via 125, metal layer 127, redistribution layer via 129, redistribution layers 131, redistribution layer via 129, metal layer 133, sub via 125, metal layer 127, sub via 125, metal layer 123, and lastly contact 121. Bonding interface 111 may divide redistribution layers 131. Second bonding via and third bonding via include (in the direction from first semiconductor material 101 to second semiconductor material 151) metal layer 133, sub via 125, metal layer 127, sub via 125, metal layer 123, and lastly contact 121. These all may have the same or different material compositions.

FIG. 1B is a circuit diagram of the wafer bonded image sensor 100A in FIG. 1A. As shown, first bonding via 191 is used to form one plate of the feedback capacitor (Cfb). A wall is formed with metals and vias (e.g., second and third bonding vias 193/195) to act as the other plate of the feedback capacitor and surrounds second floating diffusion 171. This surrounding metal wall helps to shield second floating diffusion 171 from coupling of other floating diffusions (disposed in the image sensor array but not depicted in FIGS. 1A and 1B).

The feedback capacitor (Cfb) is disposed between the first bonding via 191, second bonding via 193, and the third bonding via 195 in second semiconductor material 151 (see FIG. 1A). The distance between the second bonding via 193, the third bonding via 195, and the first bonding via 191 determines the value of Cfb (along with the composition of the dielectric material). This structure allows the overall capacitance of the feedback capacitor and the floating diffusions (i.e., Cfb and Cfd) to be reduced which results in less noise than other approaches.

Moreover, in the depicted example, first floating diffusion 107 or second floating diffusion 171 is coupled to the first terminal of the reset transistor (Nrst), and the second terminal of the reset transistor is coupled to a bitline (BIT). In response to a reset signal applied to a gate terminal of the reset transistor, the reset transistor removes charge from at least one of first floating diffusion 107 or second floating diffusion 171. An amplifier is coupled between the first floating diffusion and the bitline (BIT).

Figure 2:
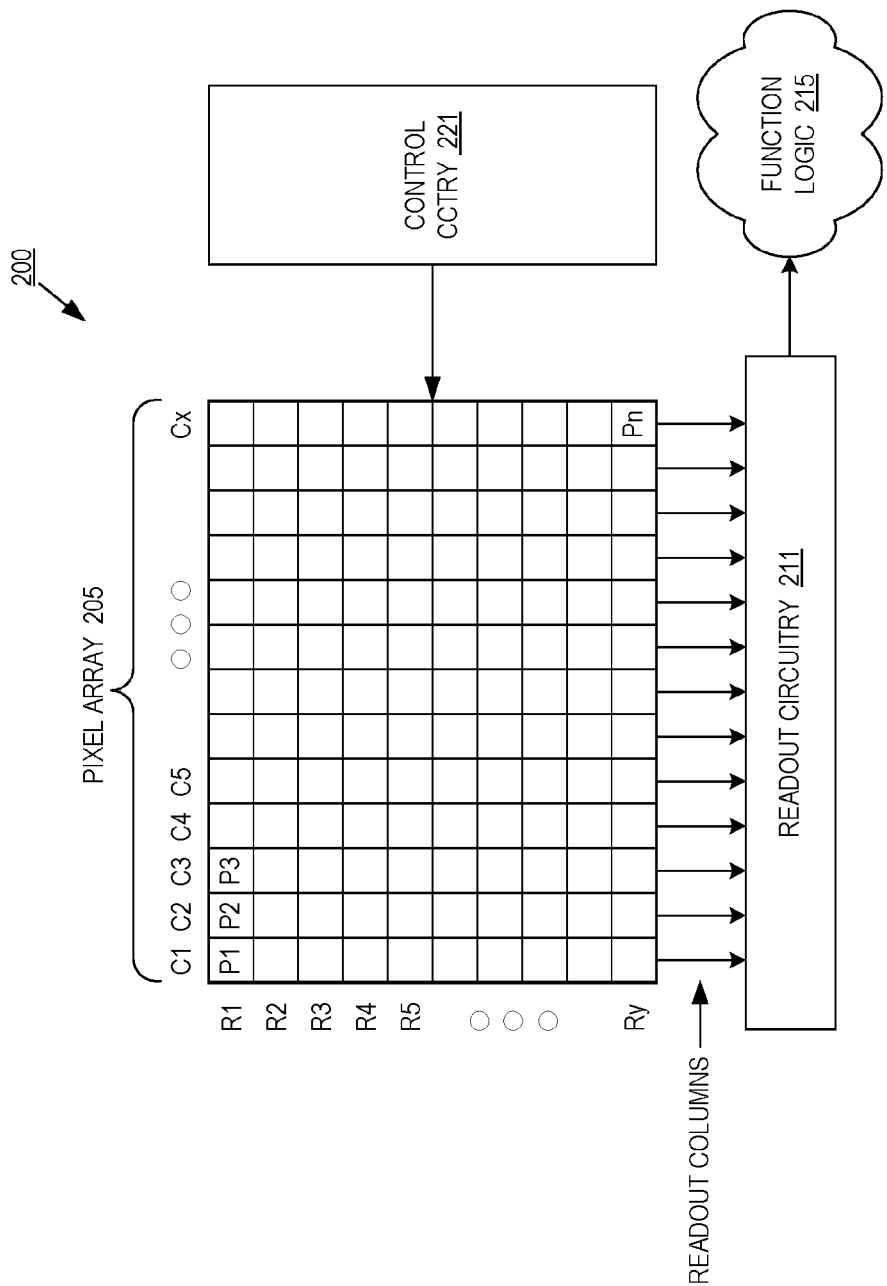
FIG. 2 is a block diagram illustrating one example of an imaging system which may include the image sensor of FIGS. 1A-1B, in accordance with the teachings of the present invention.

FIG. 2 is a block diagram illustrating one example of an imaging system 200 which may include the image sensor of FIGS. 1A-1B. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. One skilled in the art will appreciate that first bitline contact 141 or second bitline contact 143 from FIG. 1A may be included in readout circuitry of an imaging system 200. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a photodiode disposed in a first semiconductor material having a frontside and a backside opposite the frontside, wherein the photodiode is positioned to absorb image light through the backside of the first semiconductor material;
a first floating diffusion disposed proximate to the photodiode and coupled to receive image charge from the photodiode in response to a transfer signal applied to a transfer gate disposed between the photodiode and the first floating diffusion;
a second semiconductor material, including a second floating diffusion, disposed proximate to the frontside of the first semiconductor material; and
a dielectric material disposed between the first semiconductor material and the second semiconductor material including:
a first bonding via extending from the first floating diffusion to the second floating diffusion;
a second bonding via disposed laterally proximate to the first bonding via; and
a third bonding via disposed laterally proximate to the first bonding via, wherein the first bonding via is disposed between the second bonding via and the third bonding via such that the second bonding via and the third bonding via surround the first bonding via at least in part, wherein the second bonding via and the third bonding via are capacitive plates in capacitors formed by the first bonding via, the second bonding via, and the third bonding via.

2. The image sensor of claim 1, wherein the first bonding via is capacitively coupled to the second bonding via and the third bonding via.

3. The image sensor of claim 1, wherein the second semiconductor material includes a first bitline contact and a second bitline contact, and wherein the second floating diffusion is laterally disposed between the first bitline contact and the second bitline contact, and wherein the second bonding via and the third bonding via are electrically coupled to the first bitline contact and second bitline contact, respectively.

4. The image sensor of claim 3, wherein the first semiconductor material and the second semiconductor material are wafer-bonded together at a bonding interface in the dielectric material.

5. The image sensor of claim 4, wherein the second bonding via and the third bonding via are disposed to not contact the first semiconductor material.

6. The image sensor of claim 5, wherein the first bonding via includes a plurality of metal layers, and wherein a cross sectional area of a first metal layer disposed closest to the bonding interface is larger than a cross sectional area of a second metal layer disposed proximate to at least one of the first semiconductor material or the second semiconductor material.

7. The image sensor of claim 6, wherein the plurality of metal layers are electrically coupled together by a first plurality of sub-vias to produce a continuous electrical connection between the first floating diffusion and the second floating diffusion.

8. The image sensor of claim 7, wherein at least one of the first floating diffusion or the second floating diffusion is coupled to a first terminal of a reset transistor, and a second terminal of the reset transistor is coupled to the first bitline contact or the second bitline contact, and wherein in response to a reset signal applied to a gate terminal of the reset transistor, the reset transistor removes charge from at least one of the first floating diffusion or the second floating diffusion.

9. The image sensor of claim 1, wherein the first floating diffusion and the second floating diffusion are vertically aligned with respect of surface normal to the first semiconductor material and the second semiconductor material.

10. An image sensor system, comprising:
a plurality of image sensor pixels, wherein individual pixels in the image sensor system include at least one of:
a photodiode disposed in a first semiconductor material, wherein the photodiode is electrically coupled to a transfer gate, wherein in response to a transfer signal applied to the transfer gate, charge from the photodiode is transferred to a first floating diffusion disposed in the first semiconductor material;
a first bonding via extending from the first floating diffusion to a second floating diffusion disposed in a second semiconductor material;
a dielectric material disposed between the first semiconductor material and the second semiconductor material;
a second bonding via disposed proximate to the first bonding via in the dielectric material; and
control circuitry and readout circuitry including a first bitline contact and a second bitline contact, wherein the second bonding via is electrically coupled to the first bitline contact.

11. The image sensor system of claim 10, further comprising a third bonding via disposed proximate to the first bonding via, wherein the first bonding via is laterally disposed between the second bonding via and the third bonding via, wherein the third bonding via is coupled to the second bitline contact, and wherein the second bonding via and the third bonding via are capacitive plates in capacitors formed by the first bonding via, the second bonding via, and the third bonding via.

12. The image sensor system of claim 11, wherein the first bonding via is capacitively coupled to the second bonding via and the third bonding via.

13. The image sensor system of claim 11, wherein a bonding interface is disposed proximate to a center of the dielectric material where the first semiconductor material and second semiconductor materials are wafer-bonded together, wherein the first semiconductor material is part of a pixel wafer and the second semiconductor material is part of a logic wafer.

14. The image sensor system of claim 13, wherein the second bonding via and the third bonding via are disposed on a side of the bonding interface closest to the second semiconductor material.

15. The image sensor system of claim 14, wherein a plurality of metal layers are disposed in the first bonding via between the first floating diffusion and the second floating diffusion, wherein a cross sectional area of individual metal layers in the plurality of metal layers increases in a direction of the bonding interface.

16. The image sensor system of claim 15, wherein the plurality of metal layers are electrically connected by sub-vias, and wherein the sub-vias have a smaller cross sectional area than the plurality of metal layers.

17. The image sensor system of claim 11, wherein the second bonding via and the third bonding via extend less than halfway through the dielectric material.

18. The image sensor system of claim 11, wherein the first floating diffusion and the second floating diffusion are vertically aligned with respect of surface normal to the first semiconductor material and the second semiconductor material.

19. The image sensor system of claim 11, wherein the plurality of image sensor pixels are backside illuminated.

* * * * *